United States Patent
Yang et al.

(10) Patent No.: US 11,770,120 B2
(45) Date of Patent: Sep. 26, 2023

(54) BOOTSTRAP CIRCUIT SUPPORTING FAST CHARGING AND DISCHARGING AND CHIP

(71) Applicant: SHANGHAI AWINIC TECHNOLOGY CO., LTD, Shanghai (CN)

(72) Inventors: Zhifei Yang, Shanghai (CN); Haijun Zhang, Shanghai (CN); Liming Du, Shanghai (CN); Jiantao Cheng, Shanghai (CN); Hongjun Sun, Shanghai (CN); Yongqing Qiao, Shanghai (CN)

( * ) Notice: Subject to any disclaimer, the term of this patent is extended or adjusted under 35 U.S.C. 154(b) by 0 days.

(21) Appl. No.: 17/764,699

(22) PCT Filed: Sep. 22, 2020

(86) PCT No.: PCT/CN2020/116657
§ 371 (c)(1),
(2) Date: Mar. 29, 2022

(87) PCT Pub. No.: WO2021/057687
PCT Pub. Date: Apr. 1, 2021

(65) Prior Publication Data
US 2022/0352883 A1 Nov. 3, 2022

(30) Foreign Application Priority Data
Sep. 29, 2019 (CN) .......................... 201910931718.5

(51) Int. Cl.
*H03K 17/04* (2006.01)
*H03K 17/041* (2006.01)

(52) U.S. Cl.
CPC .................. *H03K 17/04106* (2013.01); *H03K 2217/0081* (2013.01)

(58) Field of Classification Search
CPC .................. H03K 17/04106; H03K 2217/0081
See application file for complete search history.

(56) References Cited

U.S. PATENT DOCUMENTS

| 10,680,596 B1 * | 6/2020 | Sun .................. H03K 17/04123 |
| 2004/0130383 A1 | 7/2004 | Du et al. |

(Continued)

FOREIGN PATENT DOCUMENTS

| CN | 104467371 A | 3/2015 |
| CN | 104821716 A | 8/2015 |

(Continued)

OTHER PUBLICATIONS

The International Search Report dated Dec. 21, 2020; PCT/CN2020/116657.

(Continued)

*Primary Examiner* — Daniel C Puentes
(74) *Attorney, Agent, or Firm* — Emerson, Thomson & Bennett, LLC; Roger D. Emerson; Jarrett Wyatt

(57) ABSTRACT

A bootstrap circuit supporting fast charging and discharging and a chip. A voltage measurement module (12) and a switch module (11) are arranged, and the voltage measurement module (12) controls an operating state of the switch module (11); during charging, under a specific condition, the switch module (11) is enabled to be in an on state so as to achieve fast charging of a voltage output end; and during discharging, the purpose of fast discharging is achieved by means of a second field effect transistor (MP5) arranged in the bootstrap circuit.

18 Claims, 5 Drawing Sheets

(56) References Cited

U.S. PATENT DOCUMENTS

2011/0163800 A1   7/2011  Soma et al.
2015/0214839 A1   7/2015  Shiu et al.
2018/0159418 A1   6/2018  Basu et al.

FOREIGN PATENT DOCUMENTS

| CN | 108768142 A |   | 11/2018 |
| CN | 109495095 A |   | 3/2019 |
| CN | 110149111 A |   | 8/2019 |
| CN | 110729990 A |   | 1/2020 |
| CN | 113726321 A | * | 11/2021 |
| JP | 5200738 B2  |   | 6/2013 |

OTHER PUBLICATIONS

The First Chinese Office Action dated Mar. 3, 2023; Appln. No. CN201910931718.5.
The First Indian Office Action dated Sep. 1, 2022; Appln. No. 202217024512.

* cited by examiner

BOOTSTRAP CIRCUIT SUPPORTING FAST CHARGING AND DISCHARGING AND CHIP The present disclosure is a National Stage application of PCT international application PCT/CN2020/116657, filed on Sep. 22, 2020 which claims priority to Chinese Patent Application No. 201910931718.5, titled "BOOTSTRAP CIRCUIT SUPPORTING FAST CHARGING AND DISCHARGING AND CHIP", filed on Sep. 29, 2019 with the China National Intellectual Property Administration, both of which are incorporated herein by reference in their entireties.

FIELD

The present disclosure relates to the technical field of integrated circuits, and in particular, to a bootstrap circuit supporting fast charging and discharging, and a chip.

BACKGROUND

With the continuous development of science and technology, a power chip, such as a D-class power amplifier, a motor drive etc., is applied to more and more products. Those power chips have advantages of a high voltage, a large drive capability, and a low cost.

To reduce the size and cost of the chip while ensuring its drive capability, a PMOS transistor on an output power stage is replaced with an NMOS transistor in the traditional technology. In a process of high-voltage DMOS, the size of a DNMOS transistor will be three to four times smaller than the size of a DPMOS transistor when the DNMOS transistor and the DPMOS transistor have the same on-resistance, and thus the size of the chip is greatly reduced by using the DNMOS transistor.

A bootstrap circuit in the chip is able to fully charge a capacitor firstly, and then cause a certain part of an amplifier circuit to generate a bootstrap phenomenon, which can increase a voltage of the bootstrap circuit, and expand a dynamic range of an output of the bootstrap circuit. Thus, a capacitor voltage and a power supply voltage are superimposed, and a voltage at a voltage output terminal of the bootstrap circuit is increased.

However, the current bootstrap circuit does not have a capacity of fast charging and discharging.

SUMMARY

In view of this, a bootstrap circuit supporting rapid charging and discharging and a chip are provided according to the present disclosure, to solve the aforementioned problems. Technical solutions according to embodiments of the present disclosure are described in the following.

A bootstrap circuit supporting rapid charging and discharging includes: a first field-effect transistor, a second field-effect transistor, a capacitor, a switch module, a voltage detection module, and a voltage difference generation module; where:

a source of the first field-effect transistor is connected to a source of the second field-effect transistor through a first connection node, and the first connection node is connected to a voltage output terminal of the bootstrap circuit;

a drain of the second field-effect transistor is connected to a first voltage input terminal of the bootstrap circuit, and a drain of the first field-effect transistor is connected to a second voltage input terminal of the bootstrap circuit;

a gate of the first field-effect transistor is connected to a gate of the second field-effect transistor through a second connection node, the second connection node is connected to a first terminal of the voltage difference generation module, and a second terminal of the voltage difference generation module is connected to the first voltage input terminal; one terminal of the capacitor is connected to the voltage output terminal, and the other terminal of the capacitor is connected to the first voltage input terminal;

a first terminal of the switch module is connected to the second voltage input terminal, a second terminal of the switch module is connected to the voltage output terminal, and a third terminal of the switch module is connected to one terminal of the voltage detection module;

the other terminal of the voltage detection module is connected to the second voltage input terminal, and is connected to a connection node of the gate of the first field-effect transistor and the voltage difference generation module;

in a case of a voltage at the first voltage input terminal in a rising state, if the voltage detection module determines that a voltage difference between the second connection node and the second voltage input terminal satisfies a preset voltage value, the switch module is controlled to be in an on state, and the capacitor is charged by the second voltage input terminal through the switch module; and in a case of the voltage at the first voltage input terminal in a drop state, if a voltage at the second connection node is less than a voltage at the voltage output terminal, the second field-effect transistor is in an on state, and the capacitor is discharged through the second field-effect transistor.

Preferably, in the bootstrap circuit, the voltage detection module includes: a third field-effect transistor, a fourth field-effect transistor, a fifth field-effect transistor, a sixth field-effect transistor, a first current source, a second current source, and a third current source; where:

a gate of the third field-effect transistor is connected to a gate of the fourth field-effect transistor through a third connection node, and the third connection node is connected to a connection node of the second current source and the fifth field-effect transistor;

a drain of the third field-effect transistor is connected to a drain of the fourth field-effect transistor through a fourth connection node, and the fourth connection node is connected to the switch module;

a source of the third field-effect transistor is connected to a connection node of the first current source and the sixth field-effect transistor, and a source of the fourth field-effect transistor is connected to the second voltage input terminal;

one terminal of the second current source is connected to a source of the fifth field-effect transistor, and the other terminal of the second current source is connected to the second voltage input terminal;

a drain of the fifth field-effect transistor is connected to the first terminal of the voltage difference generation module; and a gate of the fifth field-effect transistor is connected to a gate of the sixth field-effect transistor, and is connected to a bias voltage terminal;

one terminal of the first current source is connected to a source of the sixth field-effect transistor, and the other terminal of the first current source is connected to the second voltage input terminal; and a drain of the sixth field-effect transistor is grounded through the third current source.

Preferably, the first current source and the third current source are the same.

Preferably, the third field-effect transistor is an N-type field-effect transistor; and the fourth field-effect transistor, the fifth field-effect transistor, and the sixth field-effect transistor are all P-type field-effect transistors.

Preferably, in the bootstrap circuit, the voltage difference generation module includes: a first resistor, a seventh field-effect transistor, an eighth field-effect transistor, and a ninth field-effect transistor; where:

a gate and a drain of the seventh field-effect transistor are connected to be functioned as the first terminal of the voltage difference generation module;

a source of the seventh field-effect transistor is connected to a source of the eighth field-effect transistor;

a gate and a drain of the eighth field-effect transistor are connected through a fifth connection node, and the fifth connection node is connected to a drain of the ninth field-effect transistor;

a gate and a drain of the ninth field-effect transistor are connected, and a source of the ninth field-effect transistor is connected to a first terminal of the first resistor; and a second terminal of the first resistor is functioned as the second terminal of the voltage difference generation module, and is connected to the first voltage input terminal.

Preferably, in the bootstrap circuit, the seventh field-effect transistor and the ninth field-effect transistor are both N-type field-effect transistors; and the eighth field-effect transistor is a P-type field-effect transistor.

Preferably, in the bootstrap circuit, the switch module includes: a tenth field-effect transistor, and a fourth current source; where:

a source of the tenth field-effect transistor is connected to the second voltage input terminal, a drain of the tenth field-effect transistor is connected to the voltage output terminal, a gate of the tenth field-effect transistor is connected to the voltage detection module, and the fourth current source is connected in parallel with the tenth field-effect transistor.

Preferably, in the bootstrap circuit, the tenth field-effect transistor is a P-type field-effect transistor.

Preferably, in the bootstrap circuit, the first field-effect transistor is an N-type field-effect transistor; and the second field-effect transistor is a P-type field-effect transistor.

A chip includes the aforementioned bootstrap circuit.

Compared with the conventional technology, beneficial effects of the technical solutions of the present disclosure are described as follows.

The bootstrap circuit according to embodiments of the present disclosure is provided with the voltage detection module and the switch module, and a working state of the switch module is controlled by the voltage detection module. In a charging process, the switch module is in an on state under certain conditions, to realize the fast charging of the voltage output terminal. In a discharging process, the fast discharging is realized by the second field-effect transistor provided in the bootstrap circuit.

BRIEF DESCRIPTION OF THE DRAWINGS

In order to more clearly illustrate technical solutions in embodiments of the present disclosure or in the conventional technology, drawings used in the description of the embodiments or the conventional technology are introduced briefly hereinafter. Apparently, the drawings described in the following illustrate some embodiments of the present disclosure; other drawings may be obtained by those ordinarily skilled in the art based on these drawings without any creative efforts.

DETAILED DESCRIPTION

The technical solutions in the embodiments of the present disclosure will be described clearly and completely hereinafter in conjunction with the drawings in the embodiments of the present disclosure. Apparently, the described embodiments are only a part of the embodiments of the present disclosure, rather than all embodiments. Based on the embodiments in the present disclosure, all of other embodiments, made by the person skilled in the art without any creative efforts, fall into the scope of protection of the present disclosure.

To make the above objectives, features and advantages of the present disclosure more obvious and understandable, the technical solutions in the embodiments of the present disclosure will be described in detail hereinafter in conjunction with the drawings in the embodiments of the present disclosure.

Figure 1:
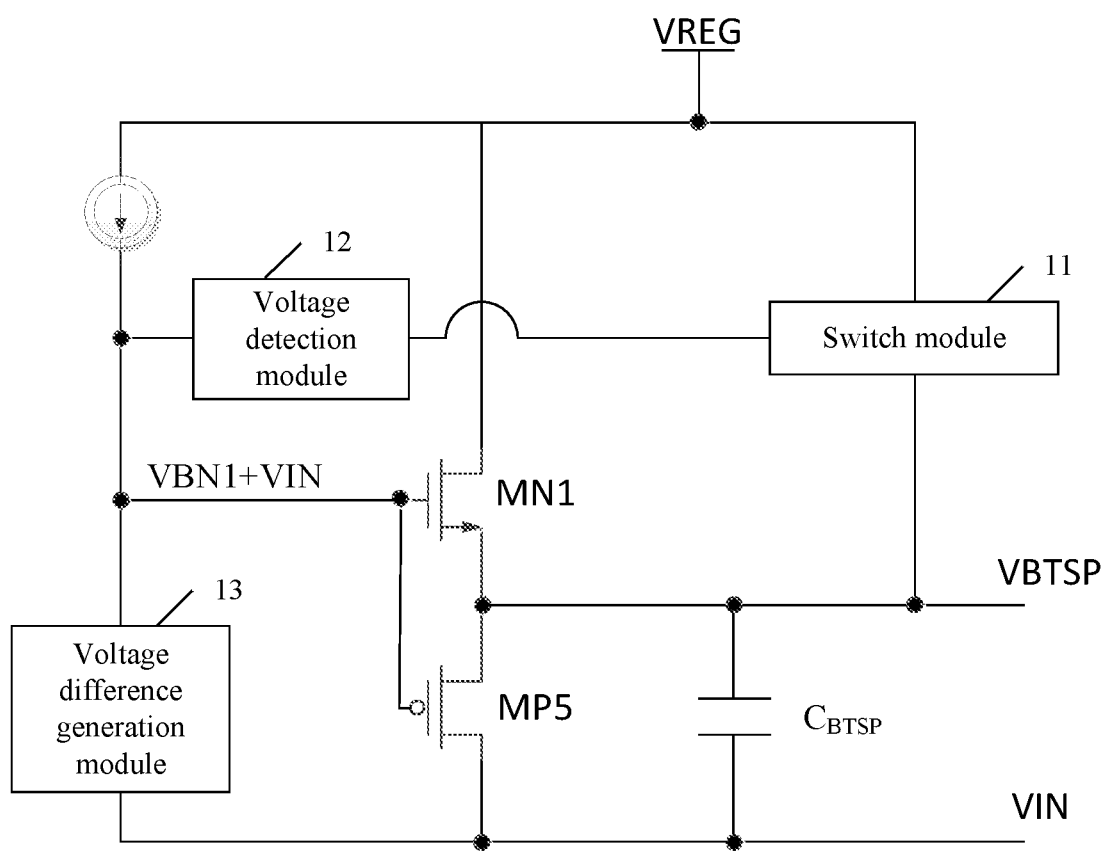
FIG. 1 is a structural schematic diagram of a bootstrap circuit according to an embodiment of the present disclosure.

Referring to FIG. 1, FIG. 1 is a structural schematic diagram of a bootstrap circuit according to an embodiment of the present disclosure.

The bootstrap circuit includes: a first field-effect transistor MN1, a second field-effect transistor MP5, a capacitor $C_{BTSP}$, a switch module 11, a voltage detection module 12, and a voltage difference generation module 13.

The source of the first field-effect transistor MN1 is connected to the source of the second field-effect transistor MP5 through a first connection node, and the first connection node is connected to a voltage output terminal of the bootstrap circuit.

The drain of the second field-effect transistor MP5 is connected to a first voltage input terminal of the bootstrap circuit, and the drain of the first field-effect transistor MN1 is connected to a second voltage input terminal of the bootstrap circuit.

The gate of the first field-effect transistor MN1 is connected to the gate of the second field-effect transistor MP5 through a second connection node, the second connection node is connected to a first terminal of the voltage difference generation module 13, and a second terminal of the voltage difference generation module 13 is connected to the first voltage input terminal. One terminal of the capacitor $C_{BTSP}$ is connected to the voltage output terminal, and the other terminal of the capacitor $C_{BTSP}$ is connected to the first voltage input terminal.

A first terminal of the switch module 11 is connected to the second voltage input terminal, a second terminal of the switch module 11 is connected to the voltage output terminal, and a third terminal of the switch module 11 is connected to one terminal of the voltage detection module 12.

The other terminal of the voltage detection module 12 is connected to the second voltage input terminal, and is connected to a connection node of the gate of the first field-effect transistor MN1 and the voltage difference generation module 13.

In the case of a voltage at the first voltage input terminal in a rising state, if the voltage detection module 12 determines that a voltage difference between the second connection node and the second voltage input terminal satisfies a preset voltage value, the switch module 11 is controlled to be in an on state, and the capacitor is charged by the second voltage input terminal through the switch module 11.

In the case of the voltage at the first voltage input terminal in a drop state, if a voltage at the second connection node is less than a voltage at the voltage output terminal, the second field-effect transistor MP5 is in an on state, and the capacitor $C_{BTSP}$ is discharged through the second field-effect transistor MP5.

The first field-effect transistor MN1 is an N-type field-effect transistor, and the second field-effect transistor MP5 is a P-type field-effect transistor.

In the embodiment, the voltage detection module and the switch module are provided, and a working state of the switch module is controlled by the voltage detection module. In a charging process, the switch module is in an on state under certain conditions, to realize the fast charging of the voltage output terminal. In a discharging process, the fast discharging is realized by the second field-effect transistor provided in the bootstrap circuit.

The specific working process of the bootstrap circuit is illustrated hereinafter.

When the voltage at the voltage output terminal is low, the first field-effect transistor MN1 is turned on, and the capacitor $C_{BTSP}$ is charged by the second voltage input terminal through the first field-effect transistor MN1. Until a voltage at an upper plate of the capacitor $C_{BTSP}$ is charged to close to a value of VIN+VBN1−VTH1, the first field-effect transistor MN1 is gradually turned off; and once the value of VIN+VBN1−VTH1 is reached, the first field-effect transistor MN1 is turned off. In the process of gradually turning off the first field-effect transistor MN1, charging current of the capacitor $C_{BTSP}$ is gradually decreased. VIN represents a voltage at the first voltage input terminal, VBN1 represents a voltage provided by the voltage difference generation module 13, and VTH1 represents a turn-on threshold voltage of the first field-effect transistor MN1.

When the voltage VIN at the first voltage input terminal rises, a voltage VBTSP at the voltage output terminal will rise due to a voltage difference between two terminals of the capacitor $C_{BTSP}$, and thus a voltage at the second connection node will also rise, where the voltage at the second connection node is equal to a value of VBN1+VIN.

Since a current source is provided between the second connection node and the second voltage input terminal, a voltage at the second connection node is unlikely to rise to a voltage VREG at the second voltage input terminal. In addition, due to the turn-on threshold voltage VTH1 of the first field-effect transistor MN1, the first field-effect transistor MN1 will be turned off once the voltage VBTSP at the voltage output terminal rises to the value of VIN+VBN1−VTH1. In this case, the voltage VBTSP at the voltage output terminal is also unlikely to rise to the voltage VREG.

In an embodiment of the present disclosure, the voltage detection module 12 is provided to detect a voltage value at the second connection node. In a rising process of the voltage VIN at the first voltage input terminal, when the voltage at the second connection node is detected to rise to a certain value, for example, a voltage difference between the voltage at the second connection node and the voltage VRGE at the second voltage input terminal satisfies a preset voltage value, the switch module 11 is in an on state, and the capacitor $C_{BTSP}$ is charged by the second voltage input terminal continuously through a branch of the switch module 11. The voltage VBTSP at the voltage output terminal is charged to VREG. Thus, a voltage difference of the capacitor $C_{BTSP}$ is equal to VREG−VIN, achieving the purpose of fast charging.

In the early stage of the charging process, the first field-effect transistor MN1 is in an on state, and the capacitor $C_{BTSP}$ is charged by the second voltage input terminal. When the voltage at the voltage output terminal continues to rise, the first field-effect transistor MN1 is turned off. Correspondingly, the switch module 11 is in the on state based on the determination of the voltage detection module 12. Thus, the capacitor $C_{BTSP}$ is charged continuously by the second voltage input terminal. The second field-effect transistor MP5 is continuously in the off state in the charging process of the capacitor $C_{BTSP}$.

When the input voltage VIN at the first voltage input terminal drops, the VBTSP fails to drop in time as the VIN drops, and VBTSP−VIN is greater than VBN1. That is, the voltage at the second connection node is less than the voltage at the voltage output terminal. In this case, the second field-effect transistor MP5 will be turned on, and the capacitor $C_{BTSP}$ will be discharged through the second field-effect transistor MP5, so that the VBTSP will decrease as the VIN drops, and the purpose of fast discharging may be achieved.

In the discharging process, the first field-effect transistor MN1 is continuously in an off state, and the switch module is closed.

Figure 2:
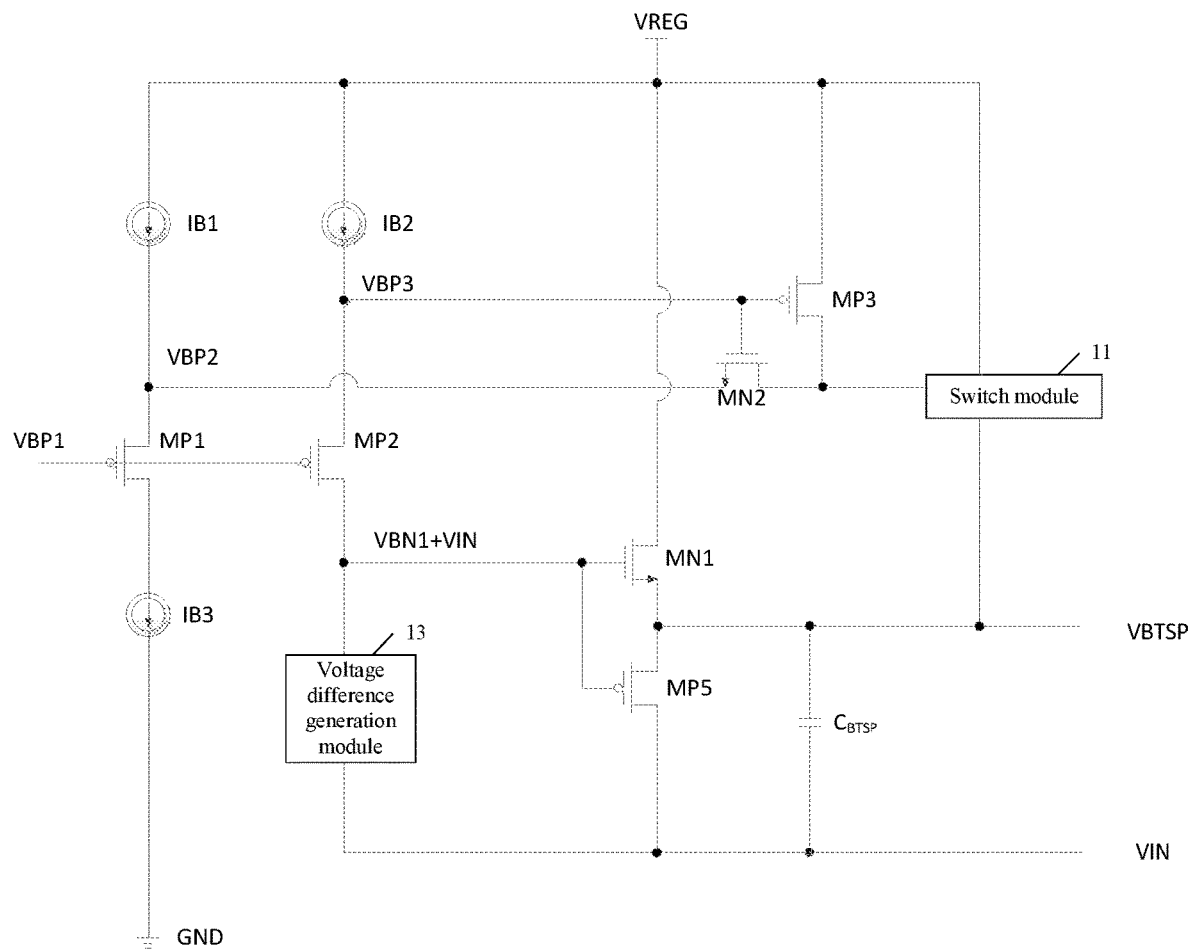
FIG. 2 is a structural schematic diagram of a bootstrap circuit according to another embodiment of the present disclosure.

Based on the foregoing embodiment of the present disclosure, referring to FIG. 2, another bootstrap circuit is provided. FIG. 2 is a structural schematic diagram of a bootstrap circuit according to another embodiment of the present disclosure.

The voltage detection module 12 includes: a third field-effect transistor MN2, a fourth field-effect transistor MP3, a fifth field-effect transistor MP2, a sixth field-effect transistor MP1, a first current source IB1, a second current source IB2, and a third current source IB3.

The gate of the third field-effect transistor MN2 is connected to the gate of the fourth field-effect transistor MP3 through a third connection node, and the third connection node is connected to a connection node of the second current source IB2 and the fifth field-effect transistor MP2.

The drain of the third field-effect transistor MN2 is connected to the drain of the fourth field-effect transistor MP3 through a fourth connection node, and the fourth connection node is connected to the switch module 11.

The source of the third field-effect transistor MN2 is connected to a connection node of the first current source IB1 and the sixth field-effect transistor MP1, and the source of the fourth field-effect transistor MP3 is connected to the second voltage input terminal VREG.

One terminal of the second current source IB2 is connected to the source of the fifth field-effect transistor MP2, and the other terminal of the second current source IB2 is connected to the second voltage input terminal VREG.

The drain of the fifth field-effect transistor MP2 is connected to the first terminal of the voltage difference generation module 13, and the gate of the fifth field-effect transistor MP2 is connected to the gate of the sixth field-effect transistor MP1, and is connected to a bias voltage terminal VBP1.

One terminal of the first current source IB1 is connected to the source of the sixth field-effect transistor MP1, and the other terminal of the first current source IB1 is connected to the second voltage input terminal VREG.

The drain of the sixth field-effect transistor MP1 is grounded through the third current source IB3.

The first current source IB1 and the third current source IB3 are the same.

The third field-effect transistor MN1 is an N-type field-effect transistor; and the fourth field-effect transistor MP3, the fifth field-effect transistor MP2, and the sixth field-effect transistor MP1 are all P-type field-effect transistors.

Figure 3:
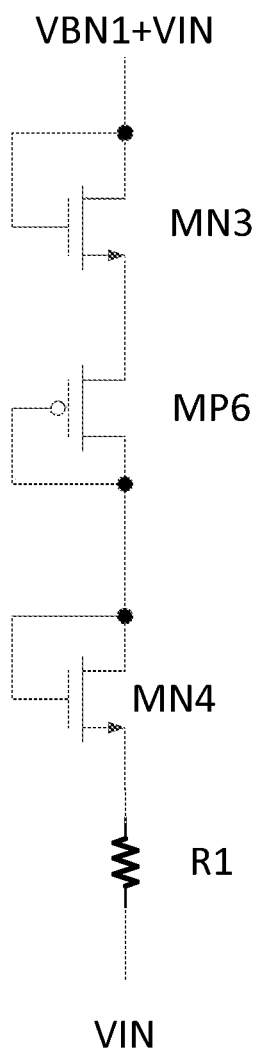
FIG. 3 is a structural schematic diagram of a voltage difference generation module according to an embodiment of the present disclosure.

Based on the foregoing embodiment of the present disclosure, referring to FIG. 3, a voltage difference generation module is provided. FIG. 3 is a structural schematic diagram of a voltage difference generation module according to an embodiment of the present disclosure.

The voltage difference generation module includes: a first resistor R1, a seventh field-effect transistor MN3, an eighth field-effect transistor MP6, and a ninth field-effect transistor MN4.

The gate and the drain of the seventh field-effect transistor MN3 are connected to be functioned as the first terminal of the voltage difference generation module.

The source of the seventh field-effect transistor MN3 is connected to the source of the eighth field-effect transistor MP6.

The gate and the drain of the eighth field-effect transistor MP6 are connected through a fifth connection node, and the fifth connection node is connected to the drain of the ninth field-effect transistor MN4.

The gate of the ninth field-effect transistor MN4 is connected to the drain of the ninth field-effect transistor MN4, and the source of the ninth field-effect transistor MN4 is connected to a first terminal of the first resistor R1.

A second terminal of the first resistor R1 is functioned as the second terminal of the voltage difference generation module 13, and is connected to the first voltage input terminal.

The seventh field-effect transistor MN3 and the ninth field-effect transistor MN4 are both N-type field-effect transistors; and the eighth field-effect transistor MP6 is a P-type field-effect transistor.

In this embodiment, the VBN1 is obtained by superimposing a sum of |VGS| values of three field-effect transistors with IB2*R1, i.e., VBN1=VGS_N3+|VGS_P6|+VGS_N4+IB2*R1.

The three field-effect transistors are connected in series, thus required values of the IB2 and the R1 are small, thereby saving power consumption and resistor size.

Figure 4:
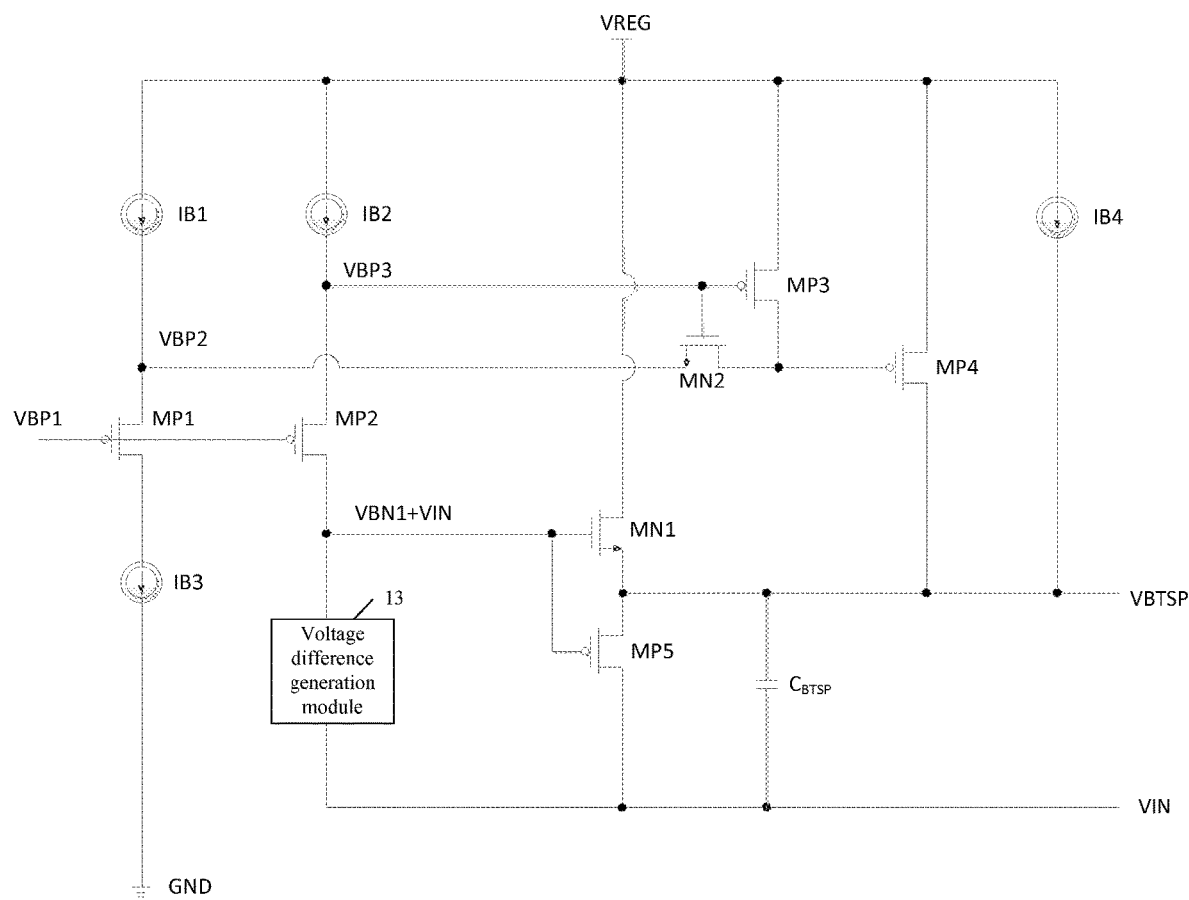
FIG. 4 is a structural schematic diagram of a bootstrap circuit according to another embodiment of the present disclosure.

Based on the foregoing embodiment of the present disclosure, referring to FIG. 4, another bootstrap circuit is provided. FIG. 4 is a structural schematic diagram of a bootstrap circuit according to an embodiment of the present disclosure.

The switch module includes a tenth field-effect transistor MP4 and a fourth current source IB4.

The source of the tenth field-effect transistor MP4 is connected to the second voltage input terminal.

The drain of the tenth field-effect transistor MP4 is connected to the voltage output terminal.

The gate of the tenth field-effect transistor MP4 is connected to the voltage detection module.

The fourth current source IB4 is connected in parallel with the tenth field-effect transistor MP4.

The tenth field-effect transistor MP4 is a P-type field-effect transistor.

In this embodiment, in a process of the first voltage input terminal decreasing from a high level VH2 to VL2, the VBTSP quickly responds to the decrease of the VIN by the tenth field-effect transistor MP4 and the fourth current source IB4, thereby improving the discharging speed of the VBTSP.

After the discharging process completes, merely the current from the fourth current source IB4 flows through the second field-effect transistor MP5.

The specific working process of the bootstrap circuit is illustrated hereinafter.

Figure 5:
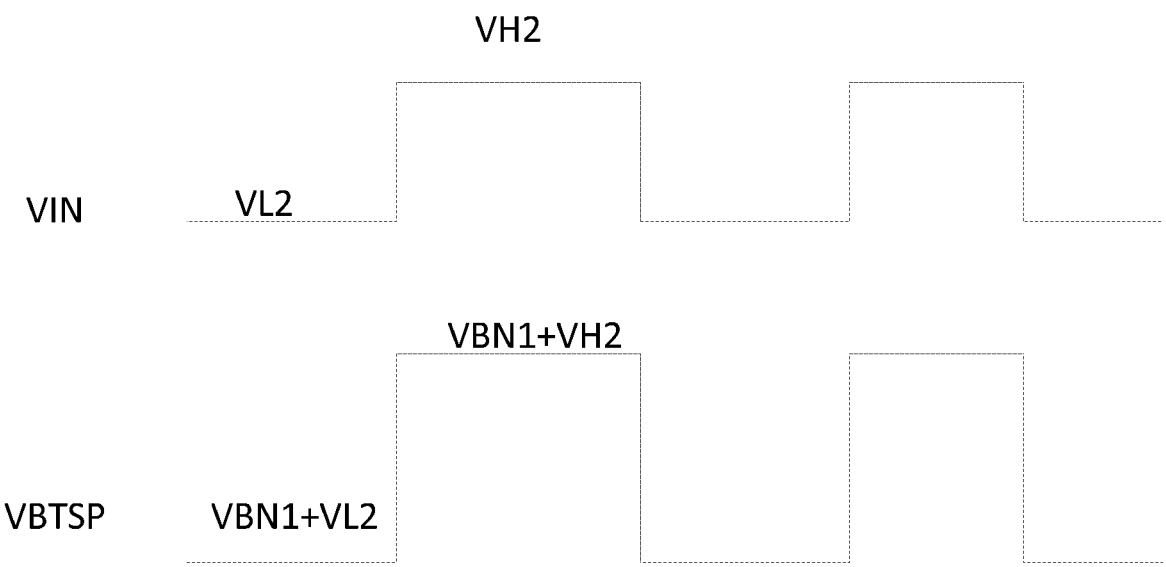
FIG. 5 is a waveform schematic diagram of a bootstrap circuit according to an embodiment of the present disclosure.

Reference is made to FIG. 5, which is a waveform schematic diagram of a bootstrap circuit according to an embodiment of the present disclosure.

It is assumed that, voltage VREG at the second voltage input terminal is expressed as a formula VREG=VBN1+VH2. In the formula, VH2 indicates a high level voltage at the first voltage input terminal.

VBP1 is a bias voltage between the fifth field-effect transistor MP2 and the sixth field-effect transistor MP1. By designing VBP1, MP1 and MP2, IB2: IB1=M: 1, (W/L) MP2: (W/L) MP1=M: 1. When the voltage VIN at the first voltage input terminal is a low level VL2, VREG−|VGS_MP1|>|Vthp|, VREG−|VGS_MP2|>|Vthp| and VREG−VBP2>Vthn. Purpose for the above setting is as follows.

When the voltage VIN at the first voltage input terminal rises to a certain level, the fifth field-effect transistor MP2 may enter a linear region, to cause VBP3−VBP2>Vthn. The transistor MP3 may be turned off, the transistor MN2 may be turned on. In this case, the transistor MP4 may be turned on, and the voltage VBTSP at the voltage output terminal is pulled up quickly.

The voltage difference generating module is used to generate a voltage VBN1, that is, a voltage difference VBTSP−VIN of a bootstrap capacitor.

When the voltage VIN at the first voltage input terminal is a low level VL2, the current of the IB2 flows through the transistor MP2 and the voltage difference generation module. The gate voltage of the MN1 is equal to VBN1+VIN, and the transistor MN1 is turned on to charge the bootstrap capacitor $C_{BTSP}$. In this case, VBTSP−VIN=VBN1. Since the gate voltage VBN1+VL2 of the MN1 is relatively low, the MP2 works in a saturation region. Since IB2: IB1=M:1 and $(W/L)_{MP2}$: $(W/L)_{MP1}$=M:1, the voltage VBP2 is equal to the voltage VBP3. The MN2 is turned off, the MP3 is turned on, and the gate voltage of the MP4 is pulled down to the voltage VREG at the second voltage input terminal, so that the transistor MP4 is turned off.

When the voltage VIN at the first voltage input terminal rises from the low level VL2 to the high level VH2, the transistor MN1 may be turned on to charge the bootstrap capacitor $C_{BTSP}$.

When the voltage VIN at the first voltage input terminal rises from the low level VL2 to the high level VH2, in a process of a voltage on an upper plate of the bootstrap capacitor $C_{BTSP}$ rising to near the value of VBN1+VH2−Vthn, the MN1 may enter a sub-threshold region, or an turn-off region. If no transistor MP4 is provided, the voltage on the upper plate of the bootstrap capacitor $C_{BTSP}$ will no longer rise, resulting in a voltage difference between the upper plate and a lower plate of the bootstrap capacitor $C_{BTSP}$ smaller than VBN1.

However, in the case that the transistor MP4 is provided in embodiments of the present disclosure, when the gate voltage VBN1+VIN of the MN1 may become VBN1+VH2, the MP2 will enter the linear region due to the circuit design VREG=VH2+VBBN1. In this way, the voltage VBP3 rises near VREG=VBN1+VH2, and thus the VGS_N2 of the MN2 is:

$$VGS\_N2=VBP3-VBP2=VREG-VBP2>Vthn.$$

At this time, the MP2 is turned on, and the gate voltage of the transistor MP4 is connected to VBP2. Since VREG−|VGS_MP1|>|Vthp| due to the bias of the VBP1, the MP4 will be turned on, and the bootstrap capacitor $C_{BTSP}$ will be quickly charged to the VREG. In this way, the voltage difference between the two terminals of the bootstrap capacitor $C_{BTSP}$ quickly raises to the VBN1, thereby improving the response speed of the bootstrap capacitor $C_{BTSP}$.

When the voltage VIN at the first voltage input terminal changes from the high level VH2 to the low level VL2, on the one hand, the voltage VBTSP on the upper plate of the bootstrap capacitor $C_{BTSP}$ decreases with the voltage VIN, since the voltage difference between the two terminals of the capacitor does not change suddenly. On the other hand, the transistor MP5 is turned on, the voltage VBTSP on the upper plate of the bootstrap capacitor drops quickly following the voltage VIN, and thus the voltage difference between the two terminals of the capacitor will not change suddenly.

In addition, as shown in FIG. 5, the voltage VBTSP at the voltage output terminal may increase/decrease as the VIN at the first voltage input terminal increases/decreases, and the voltage difference between the two terminals of the bootstrap capacitor $C_{BTSP}$ is always equal to the value of VBN1.

Based on all aforementioned embodiments of the present disclosure, a chip is further provided according to an embodiment of the present disclosure. The chip includes the aforementioned bootstrap circuit, which can achieve the purpose of rapid charging and discharging.

The bootstrap circuit supporting fast charging and discharging and the chip according to the embodiments of the present disclosure are described in detail in the above content. The principle and implementation of present disclosure are described by specific embodiments of the specification. The above description for embodiments is only for helping to understand the method and core concept of the present disclosure. For those skilled in the art, modification can be made to the specific embodiments and the application scopes based on the concept of the present disclosure, as above, the specification should not be understood to limit the present disclosure.

The embodiments in this specification are described in a progressive manner. For the same or similar parts between the embodiments, one may refer to the description of other embodiments. Each embodiment lays emphasis on differences from other embodiments. Since the system embodiment is similar to the method embodiment, the description for the system embodiment is relatively simple. For related parts, reference may be made to description in the method embodiment.

It should be further noted that, the relationship terminologies such as "first", "second" and the like are only used herein to distinguish one entity or operation from another, rather than to necessitate or imply that the actual relationship or order exists between the entities or operations. Further, the term "include", "comprise" or any variant thereof is intended to encompass nonexclusive inclusion so that a process, method, article or device including a series of elements includes not only those elements but also other elements which have not been listed definitely or an element(s) inherent to the process, method, article or device. Moreover, the expression "comprising a(n) . . . " in which an element is defined will not preclude presence of an additional identical element(s) in a process, method, article or device comprising the defined element(s) unless further defined.

Based on the above description of the disclosed embodiments, those skilled in the art are capable of carrying out or using the present disclosure. It is obvious for those skilled in the art to make many modifications to these embodiments. The general principle defined herein may be applied to other embodiments without departing from the spirit or scope of the present disclosure. Therefore, the present disclosure is not limited to the embodiments illustrated herein, but should be defined by the broadest scope consistent with the principle and novel features disclosed herein.

The invention claimed is:

1. A bootstrap circuit supporting rapid charging and discharging, comprising: a first field-effect transistor, a second field-effect transistor, a capacitor, a switch module, a voltage detection module, and a voltage difference generation module, wherein a source of the first field-effect transistor is connected to a source of the second field-effect transistor through a first connection node, and the first connection node is connected to a voltage output terminal of the bootstrap circuit;

a drain of the second field-effect transistor is connected to a first voltage input terminal of the bootstrap circuit, and a drain of the first field-effect transistor is connected to a second voltage input terminal of the bootstrap circuit;

a gate of the first field-effect transistor is connected to a gate of the second field-effect transistor through a second connection node, the second connection node is connected to a first terminal of the voltage difference generation module, a second terminal of the voltage difference generation module is connected to the first voltage input terminal; one terminal of the capacitor is connected to the voltage output terminal, and the other terminal of the capacitor is connected to the first voltage input terminal;

a first terminal of the switch module is connected to the second voltage input terminal, a second terminal of the switch module is connected to the voltage output terminal, and a third terminal of the switch module is connected to one terminal of the voltage detection module;

the other terminal of the voltage detection module is connected to the second voltage input terminal, and is connected to a connection node of the gate of the first field-effect transistor and the voltage difference generation module;

in a case of a voltage at the first voltage input terminal in a rising state, if the voltage detection module determines that a voltage difference between the second connection node and the second voltage input terminal satisfies a preset voltage value, the switch module is controlled to be in an on state, and the capacitor is charged by the second voltage input terminal through the switch module; and in a case of the voltage at the first voltage input terminal in a drop state, if a voltage at the second connection node is less than a voltage at the voltage output terminal, the second field-effect transistor is in an on state, and the capacitor is discharged through the second field-effect transistor.

2. The bootstrap circuit according to claim 1, wherein the voltage detection module comprises: a third field-effect transistor, a fourth field-effect transistor, a fifth field-effect transistor, a sixth field-effect transistor, a first current source, a second current source, and a third current source; wherein
- a gate of the third field-effect transistor is connected to a gate of the fourth field-effect transistor through a third connection node, and the third connection node is connected to a connection node of the second current source and the fifth field-effect transistor;
- a drain of the third field-effect transistor is connected to a drain of the fourth field-effect transistor through a fourth connection node, and the fourth connection node is connected to the switch module;
- a source of the third field-effect transistor is connected to a connection node between the first current source and the sixth field-effect transistor, and a source of the fourth field-effect transistor is connected to the second voltage input terminal;
- one terminal of the second current source is connected to a source of the fifth field-effect transistor, and the other terminal of the second current source is connected to the second voltage input terminal;
- a drain of the fifth field-effect transistor is connected to the first terminal of the voltage difference generation module; and a gate of the fifth field-effect transistor is connected to a gate of the sixth field-effect transistor, and is connected to a bias voltage terminal;
- one terminal of the first current source is connected to a source of the sixth field-effect transistor, and the other terminal of the first current source is connected to the second voltage input terminal; and
- a drain of the sixth field-effect transistor is grounded through the third current source.

3. The bootstrap circuit according to claim 2, wherein the first current source and the third current source are the same.

4. The bootstrap circuit according to claim 2, wherein the third field-effect transistor is an N-type field-effect transistor; and
the fourth field-effect transistor, the fifth field-effect transistor, and the sixth field-effect transistor are all P-type field-effect transistors.

5. The bootstrap circuit according to claim 1, wherein the voltage difference generation module comprises: a first resistor, a seventh field-effect transistor, an eighth field-effect transistor, and a ninth field-effect transistor; wherein
- a gate and a drain of the seventh field-effect transistor are connected to be functioned as the first terminal of the voltage difference generation module;
- a source of the seventh field-effect transistor is connected to a source of the eighth field-effect transistor;
- a gate and a drain of the eighth field-effect transistor are connected through a fifth connection node, and the fifth connection node is connected to a drain of the ninth field-effect transistor;
- a gate and a drain of the ninth field-effect transistor are connected, and a source of the ninth field-effect transistor is connected to a first terminal of the first resistor; and
- a second terminal of the first resistor is functioned as the second terminal of the voltage difference generation module, and is connected to the first voltage input terminal.

6. The bootstrap circuit according to claim 5, wherein the seventh field-effect transistor and the ninth field-effect transistor are both N-type field-effect transistors; and
the eighth field-effect transistor is a P-type field-effect transistor.

7. The bootstrap circuit according to claim 1, wherein the switch module comprises: a tenth field-effect transistor, and a fourth current source; wherein
- a source of the tenth field-effect transistor is connected to the second voltage input terminal,
- a drain of the tenth field-effect transistor is connected to the voltage output terminal,
- a gate of the tenth field-effect transistor is connected to the voltage detection module, and
- the fourth current source is connected in parallel with the tenth field-effect transistor.

8. The bootstrap circuit according to claim 7, wherein the tenth field-effect transistor is a P-type field-effect transistor.

9. The bootstrap circuit according to claim 1, wherein the first field-effect transistor is an N-type field-effect transistor; and
the second field-effect transistor is a P-type field-effect transistor.

10. A chip, comprising a bootstrap circuit, wherein the bootstrap circuit comprises: a first field-effect transistor, a second field-effect transistor, a capacitor, a switch module, a voltage detection module, and a voltage difference generation module, wherein
- a source of the first field-effect transistor is connected to a source of the second field-effect transistor through a first connection node, and the first connection node is connected to a voltage output terminal of the bootstrap circuit;
- a drain of the second field-effect transistor is connected to a first voltage input terminal of the bootstrap circuit, and a drain of the first field-effect transistor is connected to a second voltage input terminal of the bootstrap circuit;
- a gate of the first field-effect transistor is connected to a gate of the second field-effect transistor through a second connection node, the second connection node is connected to a first terminal of the voltage difference generation module, a second terminal of the voltage difference generation module is connected to the first voltage input terminal; one terminal of the capacitor is connected to the voltage output terminal, and the other terminal of the capacitor is connected to the first voltage input terminal;
- a first terminal of the switch module is connected to the second voltage input terminal, a second terminal of the switch module is connected to the voltage output terminal, and a third terminal of the switch module is connected to one terminal of the voltage detection module;
- the other terminal of the voltage detection module is connected to the second voltage input terminal, and is connected to a connection node of the gate of the first field-effect transistor and the voltage difference generation module;
- in a case of a voltage at the first voltage input terminal in a rising state, if the voltage detection module determines that a voltage difference between the second connection node and the second voltage input terminal satisfies a preset voltage value, the switch module is controlled to be in an on state, and the capacitor is charged by the second voltage input terminal through the switch module; and in a case of the voltage at the first voltage input terminal in a drop state, if a voltage at the second connection node is less than a voltage at the voltage output terminal, the second field-effect transistor is in an on state, and the capacitor is discharged through the second field-effect transistor.

11. The chip according to claim 10, wherein the voltage detection module comprises: a third field-effect transistor, a fourth field-effect transistor, a fifth field-effect transistor, a sixth field-effect transistor, a first current source, a second current source, and a third current source; wherein
a gate of the third field-effect transistor is connected to a gate of the fourth field-effect transistor through a third connection node, and the third connection node is connected to a connection node of the second current source and the fifth field-effect transistor;
a drain of the third field-effect transistor is connected to a drain of the fourth field-effect transistor through a fourth connection node, and the fourth connection node is connected to the switch module;
a source of the third field-effect transistor is connected to a connection node between the first current source and the sixth field-effect transistor, and a source of the fourth field-effect transistor is connected to the second voltage input terminal;
one terminal of the second current source is connected to a source of the fifth field-effect transistor, and the other terminal of the second current source is connected to the second voltage input terminal;
a drain of the fifth field-effect transistor is connected to the first terminal of the voltage difference generation module; and a gate of the fifth field-effect transistor is connected to a gate of the sixth field-effect transistor, and is connected to a bias voltage terminal;
one terminal of the first current source is connected to a source of the sixth field-effect transistor, and the other terminal of the first current source is connected to the second voltage input terminal; and
a drain of the sixth field-effect transistor is grounded through the third current source.

12. The chip according to claim 11, wherein the first current source and the third current source are the same.

13. The chip according to claim 11, wherein the third field-effect transistor is an N-type field-effect transistor; and the fourth field-effect transistor, the fifth field-effect transistor, and the sixth field-effect transistor are all P-type field-effect transistors.

14. The chip according to claim 10, wherein the voltage difference generation module comprises: a first resistor, a seventh field-effect transistor, an eighth field-effect transistor, and a ninth field-effect transistor; wherein
a gate and a drain of the seventh field-effect transistor are connected to be functioned as the first terminal of the voltage difference generation module;
a source of the seventh field-effect transistor is connected to a source of the eighth field-effect transistor;
a gate and a drain of the eighth field-effect transistor are connected through a fifth connection node, and the fifth connection node is connected to a drain of the ninth field-effect transistor;
a gate and a drain of the ninth field-effect transistor are connected, and a source of the ninth field-effect transistor is connected to a first terminal of the first resistor; and
a second terminal of the first resistor is functioned as the second terminal of the voltage difference generation module, and is connected to the first voltage input terminal.

15. The chip according to claim 14, wherein the seventh field-effect transistor and the ninth field-effect transistor are both N-type field-effect transistors; and
the eighth field-effect transistor is a P-type field-effect transistor.

16. The chip according to claim 10, wherein the switch module comprises: a tenth field-effect transistor, and a fourth current source; wherein
a source of the tenth field-effect transistor is connected to the second voltage input terminal,
a drain of the tenth field-effect transistor is connected to the voltage output terminal,
a gate of the tenth field-effect transistor is connected to the voltage detection module, and
the fourth current source is connected in parallel with the tenth field-effect transistor.

17. The chip according to claim 16, wherein the tenth field-effect transistor is a P-type field-effect transistor.

18. The chip according to claim 10, wherein the first field-effect transistor is an N-type field-effect transistor; and
the second field-effect transistor is a P-type field-effect transistor.

* * * * *

UNITED STATES PATENT AND TRADEMARK OFFICE
CERTIFICATE OF CORRECTION

| | |
|---|---|
| PATENT NO. | : 11,770,120 B2 |
| APPLICATION NO. | : 17/764699 |
| DATED | : September 26, 2023 |
| INVENTOR(S) | : Zhifei Yang et al. |

It is certified that error appears in the above-identified patent and that said Letters Patent is hereby corrected as shown below:

On the Title Page

Item (73) is added as follows:
"(73) Assignee: SHANGHAI AWINIC TECHNOLOGY CO., LTD. (Shanghai, CHINA)"

Signed and Sealed this
First Day of October, 2024

Katherine Kelly Vidal
*Director of the United States Patent and Trademark Office*